United States Patent
Spencer et al.

(10) Patent No.: US 7,846,803 B2
(45) Date of Patent: Dec. 7, 2010

(54) MULTIPLE MILLISECOND ANNEALS FOR SEMICONDUCTOR DEVICE FABRICATION

(75) Inventors: Gregory S. Spencer, Pflugerville, TX (US); Vishal P. Trivedi, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 474 days.

(21) Appl. No.: 11/756,197

(22) Filed: May 31, 2007

(65) Prior Publication Data

US 2008/0299750 A1  Dec. 4, 2008

(51) Int. Cl.
*H01L 21/336* (2006.01)

(52) U.S. Cl. ............... 438/308; 438/530; 438/535; 257/E21.134

(58) Field of Classification Search ......... 438/232, 438/487, 795, 301, 308, 530, 535; 257/E21.134
See application file for complete search history.

(56) References Cited

U.S. PATENT DOCUMENTS

| | | | |
|---|---|---|---|
| 6,844,250 | B1 | 1/2005 | Wang et al. |
| 6,897,118 | B1 * | 5/2005 | Poon et al. ............ 438/303 |
| 7,001,814 | B1 | 2/2006 | Halliyal et al. |
| 7,060,585 | B1 | 6/2006 | Cohen et al. |
| 2002/0001890 | A1 | 1/2002 | Lee |
| 2002/0086502 | A1 | 7/2002 | Liu et al. |
| 2002/0160592 | A1 | 10/2002 | Sohn |
| 2002/0168853 | A1 * | 11/2002 | Maa et al. ............ 438/655 |
| 2003/0082922 | A1 | 5/2003 | Lee et al. |
| 2005/0006655 | A1 * | 1/2005 | Tanaka ............ 257/80 |
| 2005/0214986 | A1 * | 9/2005 | Tanaka et al. ............ 438/149 |
| 2006/0148143 | A1 | 7/2006 | Bedell et al. |
| 2006/0275971 | A1 | 12/2006 | Fogel et al. |
| 2006/0276011 | A1 | 12/2006 | Fogel et al. |

FOREIGN PATENT DOCUMENTS

| | | |
|---|---|---|
| CN | 1399315 A | 2/2003 |
| CN | 1758417 A | 4/2006 |
| WO | 2006047442 A1 | 5/2006 |

OTHER PUBLICATIONS

Trivedi, V.P. et al.; "Performance Enhancement via Laser Anneal-Based R S/D Reduction in PD/SOI CMOS"; IEEE International SOI Conference; Oct. 2006; pp. 21-22; IEEE.
International Search Report and Written Opinion for correlating PCT Patent Application No. PCT/US2008/064100 dated Sep. 25, 2008.

* cited by examiner

*Primary Examiner*—Tuan N. Quach
(74) *Attorney, Agent, or Firm*—Kim-Marie Vo

(57) ABSTRACT

A method of forming a doped region includes, in one embodiment, implanting a dopant into a region in a semiconductor substrate, recrystallizing the region by performing a first millisecond anneal, wherein the first millisecond anneal has a first temperature and a first dwell time, and activating the region using as second millisecond anneal after recrystallizing the region, wherein the second millisecond anneal has a second temperature and a second dwell time. In one embodiment, the first millisecond anneal and the second millisecond anneal use a laser. In one embodiment, the first temperature is the same as the second temperature and the first dwell time is the same as the second dwell time. In another embodiment, the first temperature is different from the second temperature and the first dwell time is different from the second dwell time.

14 Claims, 2 Drawing Sheets

//www.w3.org/1999/xlink" xmlns="http://www.w3.org/1999/xhtml">
MULTIPLE MILLISECOND ANNEALS FOR SEMICONDUCTOR DEVICE FABRICATION

BACKGROUND

1. Field

This disclosure relates generally to semiconductor devices, and more specifically, to methods of multiple millisecond anneals for semiconductor device fabrication.

2. Related Art

As semiconductor device dimensions continue to shrink, the need for ultra-shallow junctions requires the use of a millisecond anneal to prevent undesired dopant diffusion. However, the use of the millisecond anneal alone, that is, without use of a conventional or spike anneal of source/drain extension and source/drain regions, results in significant performance loss in the resulting semiconductor device. A millisecond anneal is understood to refer to an anneal having a duration on the order of milliseconds, whereas a conventional anneal has a duration on the order of seconds.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A method according to one embodiment of the present disclosure advantageously provides for a millisecond anneal only approach using laser anneal by minimizing post anneal crystalline defectivity and maximizing dopant activation, thus improving device performance. Accordingly, the method provides for ultra-shallow junctions without loss of semiconductor device performance.

Figure 1:
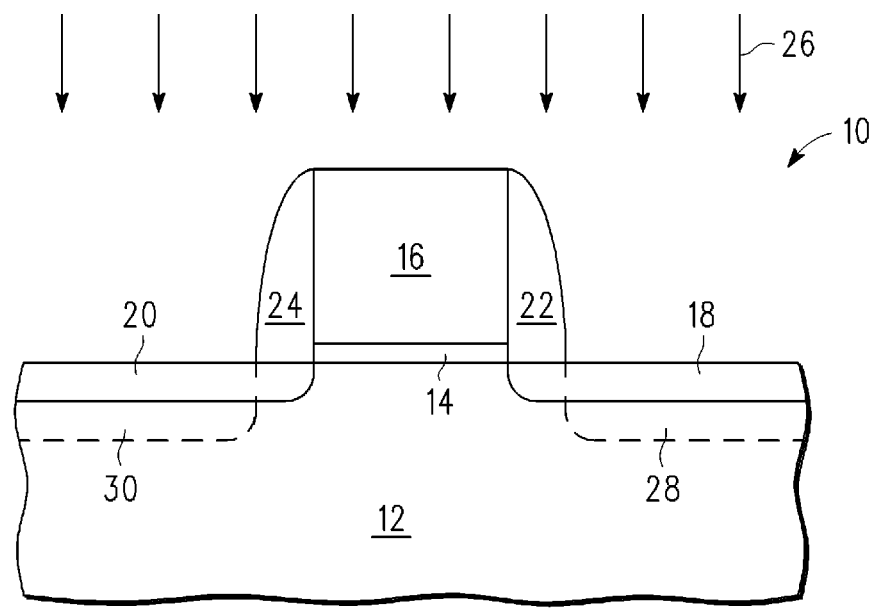
FIG. 1 is a cross-sectional view of a semiconductor device during a portion of fabrication using a method of millisecond anneal according to one embodiment of the present disclosure.

FIG. 1 is a cross-sectional view of a semiconductor device 10 during a portion of fabrication using a method of millisecond anneal according to one embodiment of the present disclosure. Semiconductor device 10 includes a semiconductor substrate 12, gate dielectric 14 and gate electrode 16. Ultra-shallow (source/drain) extension implant regions 18 and 20 are formed within substrate 12, on opposite sides of gate electrode 16. Subsequent to formation of extension regions 18 and 20, sidewall spacers 22 and 24 are formed. Subsequent to formation of the sidewall spacers, an implant 26 of dopant species forms source/drain implant regions 28 and 30. During formation of the ultra-shallow source/drain extension implant regions 18 and 20 and of source/drain implant regions 28 and 30, a certain amount of implant damage occurs within substrate 12 within the respective implant regions. In one embodiment, an amorphizing implant is conducted as part of the source/drain extension implants.

The semiconductor substrate described herein can be any semiconductor material or combinations of materials, such as gallium arsenide, silicon germanium, silicon-on-insulator (SOI), silicon, monocrystalline silicon, the like, and combinations of the above. The gate dielectric and gate electrode described herein can be any combination of gate materials, such as, oxide, oxinitride, nitride, or high-k dielectric, and the like, and poly silicon or metal gate electrode or gate electrode stack, chosen according to the requirements of a given semiconductor device application.

Figure 2:
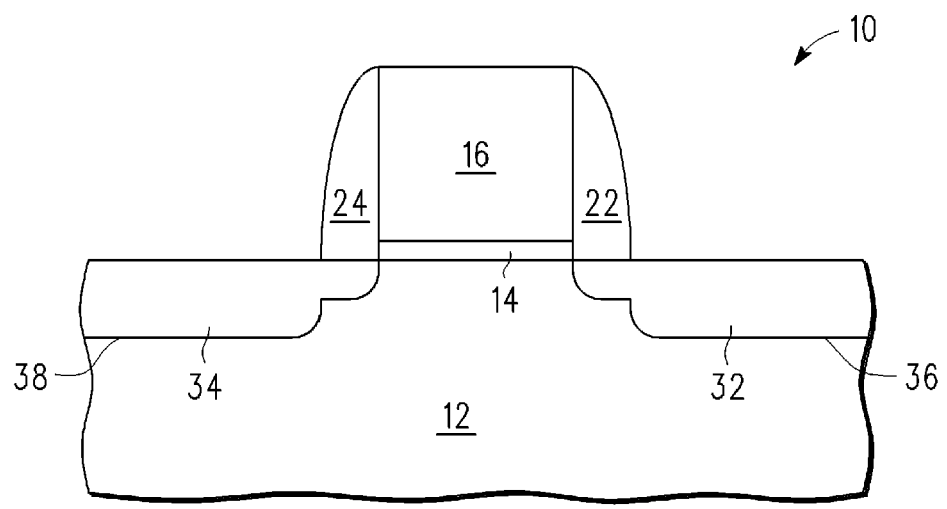
FIG. 2 is a cross-sectional view of a semiconductor device during a further portion of fabrication using the method of millisecond anneal according to one embodiment of the present disclosure.

FIG. 2 is a cross-sectional view of a semiconductor device 10 during a further portion of fabrication using the method of millisecond anneal according to one embodiment of the present disclosure. Subsequent to formation of the source/drain implant regions 28 and 30, the semiconductor device 10 is processed with a first millisecond anneal, wherein the first millisecond anneal is characterized by a low temperature and long dwell time millisecond anneal. The first millisecond anneal provides for recrystallization and repair of damage to the source/drain extension and the source/drain implant regions, wherein the recrystallized and repaired regions are indicated by reference numerals 32 and 34.

Subsequent to the first millisecond anneal, the semiconductor device 10 is processed with a second millisecond anneal, wherein the second millisecond anneal is characterized by a high temperature and short dwell time millisecond anneal. The second millisecond anneal provides for desired activation of the source/drain extension and the source/drain regions, wherein the activated source/drain extension and source/drain regions are also indicated by reference numerals 32 and 34. It is noted that during an activation with a conventional anneal, the lower surface of a corresponding implant region is subject to expand as a result of dopant diffusion. However, with the method according to the embodiments of the present disclosure, activation using the first and second millisecond anneal results in a minimal dopant diffusion beyond the boundaries of the original source/drain extension and source/drain implant regions. For example, with respect to a boron implant, the second millisecond anneal results in an approximate eight angstrom (8 Å) diffusion beyond the boundary of the original implant region. Accordingly, the lower boundaries 36 and 38 of source/drain extension regions 18 and 20 and the source/drain regions 32 and 34 are substantially the same as corresponding lower boundaries of the source/drain extension and the source/drain implant regions prior to the second millisecond anneal.

Figure 3:
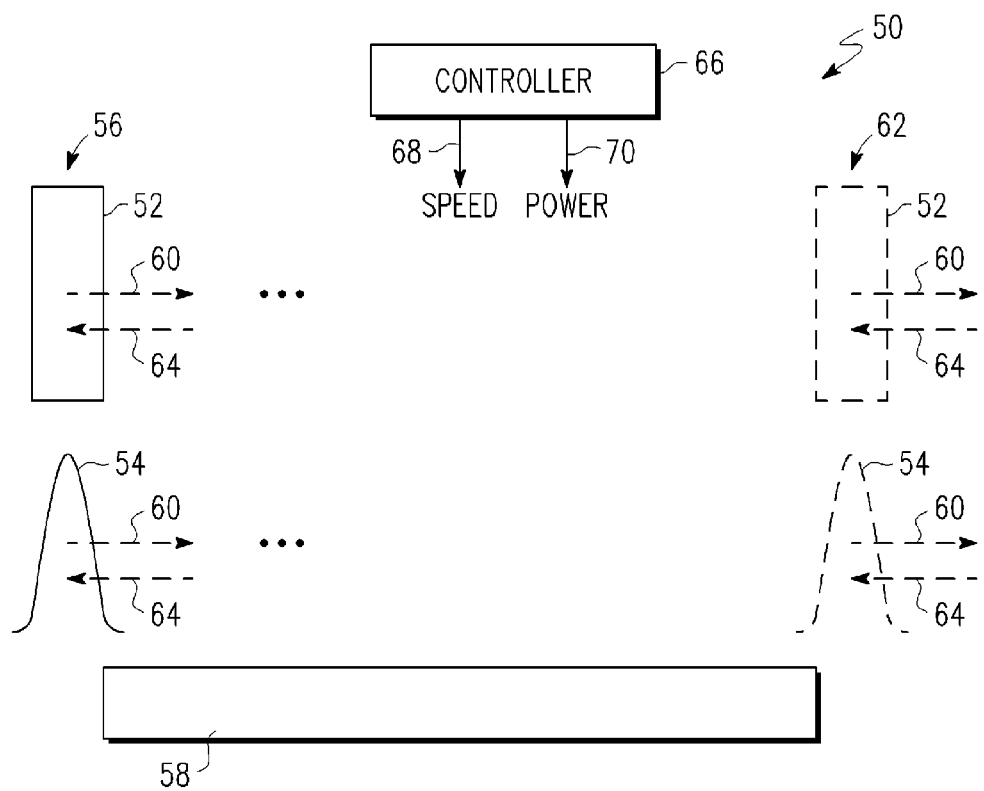
FIG. 3 is a diagrammatic view of elements for implementing the method of millisecond anneal according to one embodiment of the present disclosure.

FIG. 3 is a diagrammatic view 50 of elements for implementing the method of millisecond anneal according to one embodiment of the present disclosure. View 50 illustrates a laser source 52 which is configured to provide an anneal intensity profile as indicated by profile 54. Laser source 52 is further configured to move between a first position, as indicated by reference numeral 56, with respect to a surface of semiconductor wafer 58 and a second position, as indicated by reference numeral 62. Semiconductor wafer 58 includes, for example, semiconductor structures similar to the semiconductor device as illustrated in FIG. 2. In addition, laser source 52 moves in a first direction relative to wafer 58, as indicated by reference numeral 60, from the first position 56 to the second position 62. Movement of the laser relative to the wafer can include, for example, a scan of a corresponding laser beam across the wafer or movement of the wafer with respect to the corresponding laser beam, or combinations thereof. Furthermore, laser source 52 moves in a second direction relative to wafer 58, as indicated by reference numeral 64, from the second position 64 to the first position 56. A controller 66 provides various control signals to the laser source 52 (and to any additional translation stages and/or mirrors (not shown) that may be used in carrying out linear translations between the laser source and the semiconductor wafer). For example, controller 66 provides a speed control signal at 68 and a power control signal at 70, as will be discussed further herein.

Figure 4:
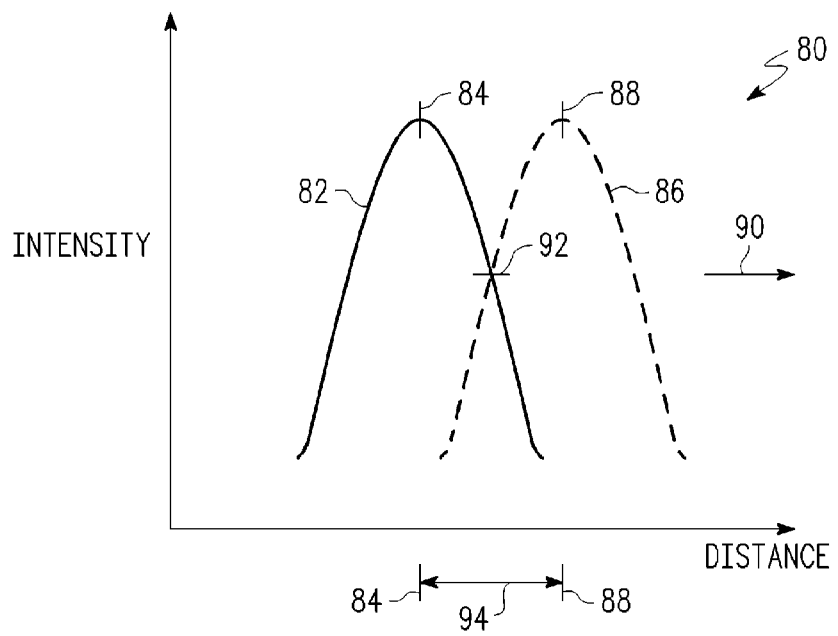
FIG. 4 is a graphical view of millisecond anneal intensity profiles versus distance for understanding dwell time as used in implementing the method of millisecond anneal according to the embodiments of the present disclosure.

FIG. 4 is a graphical view 80 of millisecond anneal intensity profiles versus distance for understanding dwell time as used in implementing the method of millisecond anneal according to the embodiments of the present disclosure. Dwell time, as used herein, corresponds to an amount of time that an intensity profile takes to move a full width at half maximum across a point on the wafer surface. In particular, as shown in FIG. 4, intensity profile 82 is centered at position 84 as shown by a solid line. The anneal intensity profile 86 is centered at position 88, as shown by a dashed line. The anneal intensity profile 82 is the same as the anneal intensity profile 86, with the exception that the anneal intensity profile 86 represents the anneal intensity profile 82 which has been moved a full width 94 at half maximum 92 in the direction indicated by reference numeral 90. In addition, the half maximum point 92 is representative of one-half of the maximum intensity of the intensity profile, wherein a spacing between the left and right portions of the same intensity profile at the half maximum point 92 corresponds to a full width of the intensity profile. The dwell time of the anneal is, therefore, dependent upon the relative speed 68 of the laser source 52 with respect to the wafer 58 in FIG. 3, and the full width at half maximum 94 of the anneal intensity profile 82 in FIG. 4. The temperature of the millisecond anneal is dependent upon the dwell time of the anneal and the laser power 70 in FIG. 3.

The method includes use of multiple-pass laser anneal for millisecond anneal of dopants within the device with anneal times and anneal temperatures optimized to increase device performance.

Use of multiple anneal passes with laser anneal allows for optimization of laser-only recrystallization and dopant activation: Lower Temperature allows for longer dwell times for improved recrystallization. Higher Temperature used for activation with short dwell time to reduce diffusion and leakage.

In one embodiment, the method includes source/drain extension implants including amorphization, a first laser anneal, and a second laser anneal. The first laser anneal is characterized by a low-temperature and long dwell time, further being configured to provide a desired re-crystallization. The second laser anneal is characterized by a high-temperature and short dwell time, further being configured to provide a desired dopant activation.

In one embodiment, the method includes performing multiple passes of laser anneal with dwell times less than 10 msec and temperatures in a range greater than 700 degrees Celsius and less than 1412 degrees Celsius. DC performance can be increased by multiple passes through laser anneal for source/drain extension and source/drain activation, especially for laser-only integrations with amorphizing implants. Multiple passes could be with the same conditions or differing conditions to optimize a desired semiconductor device performance.

In one embodiment, the method includes performing a low temperature, long dwell time anneal to recrystallize amorphization and minimize crystalline defectivity. For example, the low temperature can include on the order of 1275 C. and the dwell time can include on the order of 1.2 msec. In addition, the method includes performing a high temperature, short dwell time anneal to activate dopants with minimal undesirable diffusion. For example, the high temperature can include on the order of 1375 C. and the dwell time can include on the order of 0.5 msec. A combination of double anneals in this manner according to one embodiment of the present disclosure can advantageously serve to further improve a device performance of a given semiconductor device made using the method.

In one embodiment, source/drain extension and/or source/drain regions are epitaxially grown with semiconductor material different from and with lower melting temperature than the remaining regions of the substrate, such as silicon germanium source/drain on silicon substrate, and multiple passes of laser scan are performed to improve dopant activation without melting the source/drain extension and/or source/drain regions. Multiple laser anneals with temperatures and dwell times lower than the melting condition of the different material source/drain extension and/or source/drain regions improve dopant activation to a degree that would otherwise require temperature and dwell time higher than the melting condition of the different material source/drain and/or source/drain extension regions.

The method according to the embodiments of the present disclosure advantageously provide for laser-only integration for ultra-shallow source/drain extension and source/drain activation of sub-micron transistor devices.

By now it should be appreciated that there has been provided a method of forming a doped region comprises implanting a dopant into a region in a semiconductor substrate, performing a first anneal in the region using a laser, and performing a second anneal in the region using the laser after performing the first anneal. The first anneal has a first temperature and a first dwell time, wherein the semiconductor substrate moves relative to the laser during the first anneal. The second anneal has a second temperature and a second dwell time, wherein the semiconductor substrate moves relative to the laser during the second anneal. Subsequent to the first and second anneals, the region has been recrystallized and the dopant within the region has been activated. Implanting the dopant into the region in the semiconductor substrate can comprise implanting the dopant into a source/drain region. In one embodiment, the laser comprises a continuous wave laser. As used herein, where appropriate, the term "laser" also refers to a laser beam that emanates from a laser source. In another embodiment, the semiconductor substrate comprises a device, the device comprises the region, and the laser has a wavelength greater than a device length of the device. A device length can include, for example, a dimension of the semiconductor device extending between two isolation regions.

In one embodiment, the first temperature is the same as the second temperature. In addition, the first dwell time can be the same as the second dwell time. For example, in one embodiment, the first temperature is approximately 1325 degrees Celsius and the second temperature are approximately 1325 degrees Celsius. Furthermore, the first dwell time and the second dwell time are approximately 0.8 milliseconds.

In another embodiment, the first temperature is different from the second temperature. In addition, the first dwell time can be different from the second dwell time. For example, the first temperature is between approximately 1200 degrees Celsius and approximately 1300 degrees Celsius and the second temperature is greater than approximately 1300 degrees Celsius. Furthermore, the first dwell time is less than approximately 0.8 milliseconds and the second dwell time is greater than approximately 0.8 milliseconds.

In yet another embodiment, the first temperature comprises approximately 1275 degrees Celsius and the second temperature comprises approximately 1375 degrees Celsius. In addition, the first dwell time comprises approximately 1.2 milliseconds and the second dwell time comprises approximately 0.5 milliseconds.

In another embodiment, the method further comprises performing a third anneal in the region using the laser, wherein the third anneal is performed after the first anneal and before the second anneal.

According to another embodiment, an apparatus is configured to perform the method of forming a doped region that comprises implanting a dopant into a region in a semiconductor substrate, performing a first anneal in the region using a laser, and performing a second anneal in the region using the laser after performing the first anneal. The first anneal has a first temperature and a first dwell time, wherein the semiconductor substrate moves relative to the laser during the first anneal. The second anneal has a second temperature and a second dwell time, wherein the semiconductor substrate moves relative to the laser during the second anneal. Subsequent to the first and second anneals, the region has been recrystallized and the dopant within the region has been activated.

Yet another embodiment, a method of forming a doped region comprises implanting a dopant into a region in a semiconductor substrate, performing a first anneal using a first laser, and performing a second anneal using a second laser after performing the first anneal. The first anneal has a first temperature and a first dwell time and the second anneal has a second temperature and a second dwell time. In addition, the second laser comprises a continuous wave laser. In one embodiment, the first laser is the same as the second laser.

In a further embodiment, a method of forming a doped region comprises implanting a dopant into a region in a semiconductor substrate, recrystallizing the region by performing a first millisecond anneal, wherein the first millisecond anneal has a first temperature and a first dwell time and activating the region using as second millisecond anneal after recrystallizing the region, wherein the second millisecond anneal has a second temperature and a second dwell time. The first millisecond anneal is a first laser anneal and the second millisecond anneal is a second laser anneal.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the first or second millisecond anneal may comprise a flash lamp anneal with an appropriate dwell time or times. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a doped region, the method comprising:
    implanting a dopant into a region in a semiconductor substrate, wherein the region comprises source/drain extension and/or source/drain regions that are epitaxially grown with semiconductor material different from and with lower melting temperature than remaining regions of the semiconductor substrate;
    performing a first anneal in the region using a laser, wherein:
        the first anneal has a first temperature and a first dwell time; and
        the semiconductor substrate moves relative to the laser during the first anneal;
    performing a second anneal in the region using the laser after performing the first anneal, wherein:
        the second anneal has a second temperature and a second dwell time;
        the semiconductor substrate moves relative to the laser during the second anneal;
        after the second anneal the region is recrystallized and the dopant is activated in the region; and
    performing additional anneals in the region with the laser to improve dopant activation without melting the different material source/drain extension and/or source/drain regions, the additional laser anneals being performed with temperatures and dwell times lower than a melting condition of the different material source/drain extension and/or source/drain regions and improving a corresponding dopant activation to a degree that would otherwise require a temperature and dwell time higher than the melting condition of the different material source/drain extension and/or source/drain regions.

2. The method of claim 1, wherein the first temperature is the same as the second temperature.

3. The method of claim 1, wherein the first dwell time is the same as the second dwell time.

4. The method of claim 1, wherein the first temperature is approximately 1325 degrees Celsius and the second temperature are approximately 1325 degrees Celsius.

5. The method of claim 4, wherein the first dwell time and the second dwell time are approximately 0.8 milliseconds.

6. The method of claim 1, wherein the first temperature is different from the second temperature.

7. The method of claim 6, wherein the first dwell time is different from the second dwell time.

8. The method of claim 7, wherein the first temperature is between approximately 1200 degrees Celsius and approximately 1300 degrees Celsius and the second temperature is greater than approximately 1300 degrees Celsius.

9. The method of claim 8, wherein the first temperature is approximately 1275 degrees Celsius and the second temperature is approximately 1375 degrees Celsius.

10. The method of claim 9, wherein the first dwell time is approximately 1.2 milliseconds and the second dwell time is approximately 0.5 milliseconds.

11. The method of claim 7, wherein the first dwell time is less than approximately 0.8 milliseconds and the second dwell time is greater than approximately 0.8 milliseconds.

12. The method of claim 1, wherein implanting the dopant into the region in the semiconductor substrate comprises implanting the dopant into source/drain extension and source/drain regions.

13. The method of claim 1, further comprising:
performing a third anneal in the region using the laser, wherein the third anneal is performed after the first anneal and before the second anneal.

14. The method of claim 1, wherein the laser is a continuous wave laser.

* * * * *